(12) United States Patent
Nguyen

(10) Patent No.: US 7,078,355 B2
(45) Date of Patent: Jul. 18, 2006

(54) METHOD AND SYSTEM OF COATING POLYMER SOLUTION ON SURFACE OF A SUBSTRATE

(75) Inventor: Andrew Nguyen, San Jose, CA (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/748,370

(22) Filed: Dec. 29, 2003

(65) Prior Publication Data

US 2005/0148204 A1    Jul. 7, 2005

(51) Int. Cl.
| | |
|---|---|
| H01L 21/31 | (2006.01) |
| H01L 21/469 | (2006.01) |
| B05D 3/12 | (2006.01) |
| B05C 11/00 | (2006.01) |
| B05C 11/02 | (2006.01) |

(52) U.S. Cl. ............... 438/780; 438/781; 438/689; 438/758; 427/240; 118/52

(58) Field of Classification Search ............ 438/758, 438/761, 780, 787, 689, 782, 781; 427/356, 427/402, 240; 118/680, 682, 708, 610, 52, 118/320, 688–694, 683, 684
See application file for complete search history.

(56) References Cited

U.S. PATENT DOCUMENTS

| | | | |
|---|---|---|---|
| 5,405,443 A | | 4/1995 | Akimoto et al. |
| 5,670,210 A | | 9/1997 | Mandal et al. |
| 5,854,953 A | * | 12/1998 | Semba ............... 396/611 |
| 5,857,619 A | | 1/1999 | Huang et al. |
| 5,954,878 A | | 9/1999 | Mandal et al. |
| 5,989,622 A | * | 11/1999 | Iwashita et al. ........... 427/58 |
| 6,021,921 A | * | 2/2000 | Lan et al. ................ 222/61 |
| 6,027,760 A | | 2/2000 | Gurer et al. |
| 6,139,639 A | * | 10/2000 | Kitamura et al. ......... 118/680 |
| 6,177,133 B1 | | 1/2001 | Gurer et al. |
| 6,238,735 B1 | | 5/2001 | Mandal et al. |
| 6,287,636 B1 | * | 9/2001 | Kokubo et al. ......... 427/356 |
| 6,327,793 B1 | | 12/2001 | Gurer et al. |
| 6,340,643 B1 | * | 1/2002 | Ueda ..................... 438/780 |
| 6,391,111 B1 | * | 5/2002 | Fujimoto et al. ........ 118/321 |

(Continued)

FOREIGN PATENT DOCUMENTS

| | | |
|---|---|---|
| JP | 58 03153 A | 5/1983 |
| JP | 08203359 A * | 8/1996 |

OTHER PUBLICATIONS

PCT International Search Report for PCT Application No. PCT/US2004/033903. Mailed Mar. 6, 2005, (7pages).

*Primary Examiner*—B. William Baumeister
*Assistant Examiner*—Igwe U. Anya
(74) *Attorney, Agent, or Firm*—Blakely, Sokoloff, Taylor & Zafman, LLP

(57) ABSTRACT

A method and system of coating a polymer solution on a substrate such as a semiconductor wafer. The method includes providing a substrate. Dispensing a polymer solution onto the surface of the substrate using a pump. The pump is connected in-line with a buffer tank and a polymer solution source such that the pump draws the polymer solution from the polymer solution source and the buffer tank in a continuous fluid path to dispense the polymer solution. The polymer solution source is connected to a pressure source capable of causing a transfer of the polymer solution from the polymer solution source into the buffer tank. The buffer tank to maintain a relatively constant level of polymer solution.

17 Claims, 9 Drawing Sheets

U.S. PATENT DOCUMENTS

| | | | |
|---|---|---|---|
| 6,500,242 B1 * | 12/2002 | Fu et al. | 96/157 |
| 6,517,979 B1 * | 2/2003 | Kokubo et al. | 430/7 |
| 6,641,670 B1 * | 11/2003 | Tsujii et al. | 118/610 |
| 6,962,627 B1 * | 11/2005 | Sekiguchi et al. | 118/693 |
| 2001/0002026 A1 | 5/2001 | Soberanis et al. | |
| 2002/0124798 A1 | 9/2002 | Kitano et al. | |
| 2004/0060949 A1 * | 4/2004 | Yamauchi | 222/556 |
| 2004/0144736 A1 * | 7/2004 | Yajima | 210/805 |

* cited by examiner

METHOD AND SYSTEM OF COATING POLYMER SOLUTION ON SURFACE OF A SUBSTRATE

BACKGROUND

1. Field

Aspects of this disclosure pertain to a method and system of coating a polymer solution such as a photoresist polymer solution over a surface of a substrate such as silicon substrate.

2. Discussion of Related Art

The manufacture of integrated circuits involves the transfer of geometric shapes on a mask to the surface of a semiconductor wafer. Thereafter the semiconductor wafer corresponding to the geometric shapes or corresponding to the areas between the geometric shapes is etched away. The transfer of the shapes from the mask to the semiconductor wafer typically involves a lithographic process. This includes applying a photosensitive pre-polymer solution to the semiconductor wafer. The solvent in the pre-polymer solution is removed by evaporation, and the resulting polymer film is then baked. The film is exposed to radiation, for example ultraviolet light, through a photomask supporting the desired geometric patterns. The images in the photosensitive material are then developed by soaking the wafer in a developing solution. The exposed or unexposed areas are removed in the developing process, depending on the nature of the photosensitive material. Thereafter the wafer is placed in an etching solution which etches away the areas not protected by the photosensitive material. Due to their resistance to the etching process, the photosensitive materials are also known as photoresists. These may for instance be sensitive to ultraviolet light, electron beams, x-rays, or ion beams.

Systems and methods have been developed for the dispensing the photoresist solutions on a substrate. Typically, the system includes a pump connected to a reservoir containing a photoresist solution. The reservoir may be filled with the photoresist solution from a photoresist solution source. A vacuum source can typically be used to transfer the photoresist solution from the source into the reservoir. One problem with the current systems and methods is the non-uniformity in the photoresist film of photoresist coated on the substrate. For instance, when the photoresist solution source is low and required changing, micro bubbles and air may get into the system causing non-uniformity in the photoresist film. Additionally, when the vacuum is used to transfer the photoresist solution, splattering tends to occur in the reservoir causing the viscosity of the polymer solution to change or increase over time and inhibiting the leveling of the resulting film. This produces thickness non-uniformities in the photoresist film.

The high cost of the photoresist solutions (or other polymer solutions) makes it desirable to devise methods of improving the efficiency of the coating process so as to minimize the polymer solution's consumption. Furthermore, thickness uniformity of the photoresist layer is an important criterion in the manufacture of integrated circuits. It ensures satisfactory reproduction of the geometric patterns on the semiconductor wafer.

BRIEF DESCRIPTION OF THE DRAWINGS

The disclosure is illustrated by way of embodiment and not by way of limitation in the figures of the accompanying drawings in which like references indicate similar elements.

The invention may best be understood by referring to the following description and accompanying drawings that are used to illustrate embodiments of the invention. In the drawings.

The features of the described embodiments are specifically set forth in the appended claims. The embodiments are best understood by referring to the following description and accompanying drawings, in which similar parts are identified by like reference numerals.

SUMMARY

Figure 1:
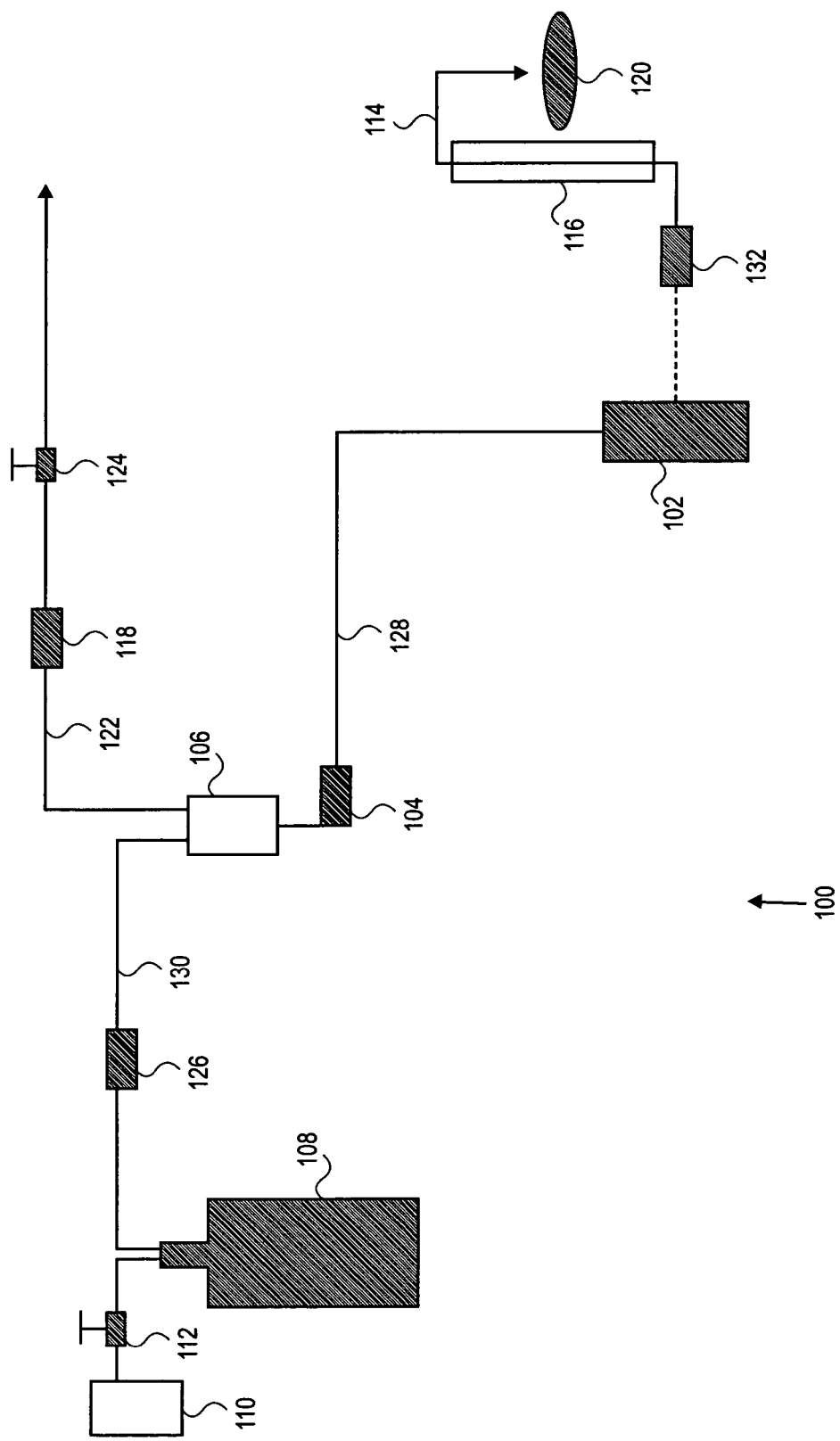
FIG. 1 illustrates an embodiment of a polymer solution coating system in accordance with the present invention.

In one aspect of the invention, an embodiment includes a method of coating a surface of a substrate with a polymer solution in which a substrate is provided. A polymer solution is dispensed onto the surface of the substrate using a coating system having a pump connected in-line with a buffer tank and a polymer solution source such that the pump draws the polymer solution from the polymer solution source and the buffer tank in a continuous fluid path to dispense the polymer solution. The polymer solution source is connected to a pressure source capable of causing a transfer of the polymer solution from the polymer solution source into the buffer tank. The buffer tank to maintain a relatively constant level of polymer solution to prevent the pump from drawing air to dispense on the surface of the substrate. The buffer tank to maintain a relatively constant level of polymer solution in that the buffer tank is filled to a predetermined level and when the pump draws the polymer solution, it draws the polymer solution in a continuous fluid path from the polymer solution source. Thus, the polymer solution in the buffer tank is maintained at a relatively constant level.

In another aspect of the invention, an embodiment includes a polymer solution coating system. The polymer solution coating system comprises a substrate station to support a substrate. The substrate station may be rotatable. A pump to dispense a polymer solution over a surface of the substrate is included. A buffer tank and a polymer solution source connected in-line with the pump wherein the buffer tank is connected between the polymer solution source and the pump. The pump is configured to channel or draw the polymer solution from the polymer solution source and the buffer tank in a continuous fluid path. The buffer tank to maintain a relatively constant level of polymer solution to prevent the pump from drawing air to dispense on the surface of the substrate. A momentary valve is coupled to the polymer solution. The momentary valve to allow a controlled supply of pressure of gas into the polymer solution source to fill the buffer tank upon demand. The momentary valve also can be used to prevent the supply of gas to be continuously supplied into the polymer solution source in the event that the operator forgets to move the gas source. As pressure is applied to the polymer solution source, some polymer solution is transferred to fill the buffer tank to a predetermined level.

In another aspect of the invention, an embodiment includes a method of coating a polymer solution over a surface of a substrate. The method comprises securing a substrate on a rotable substrate station. A polymer solution is dispensed onto the surface of the substrate using a coating system having a pump connected in-line with a buffer tank and a polymer solution source. The pump draws the polymer solution from the polymer solution source and the buffer tank in a continuous fluid path to dispense the polymer solution on the surface of the substrate. The polymer solution level in the buffer tank is maintained at a constant level to prevent the pump from drawing air to dispensed over substrate. The substrate is spun or rotated while the polymer solution is being dispensed over the surface.

DETAILED DESCRIPTION

Exemplary embodiments are described with reference to specific configurations and techniques. Those of ordinary skill in the art will appreciate the various changes and modifications to be made while remaining within the scope of the appended claims. Additionally, well known elements, pumps, sensors, tubes, process steps and the like are not set forth in detail. The following description and drawings are illustrative of the invention and are not to be construed as limiting the invention.

The embodiments of the present invention direct to methods and systems of coating a surface of a substrate such as a semiconductor wafer with a polymer solution such as a photoresist solution. In addition, the embodiments pertain to methods and systems of improving the thickness uniformity of coatings formed when depositing polymer solutions on substrates and reducing the wastage of such solutions. In particular, the methods and systems will be described with more reference to semiconductor wafers used in the manufacture of integrated circuits and the application of photoresist pre-polymer solutions to a surface of a semiconductor wafer. It will be appreciated that films or coatings used in integrated circuit manufacture are not limited to photoresist layers and could, for example, include materials such as organic planarization films, anti-reflection films, siloxane spin-on-glass films, polyimide films, and polimide siloxane films.

In one embodiment, a polymer solution such as a photoresist solution has a solute content ranging from about 10% to about 50% by weight. In one embodiment, the photoresist solution is a deep-ultraviolet photoresist polymer.

FIG. 1 illustrates a polymer solution coating system 100 that can be used to coat a polymer layer such as a photoresist on a substrate such as a semiconductor wafer 120. In one embodiment, the polymer solution coating system 100 includes pump 102, an enable valve 104, a buffer tank 106, a polymer solution source 108, a pressure source 110, and a momentary valve 112. The pump 102, the polymer solution source 108, and the buffer tank 106 are connected in-line such that when the pump 102 channels or draws the polymer solution, it draws the solution in a continuous fluid path from the polymer solution source 108 through the buffer tank 106 to dispense the polymer solution onto the surface of the wafer 120. In one embodiment, a dispensing line 114 from the pump 102 is provided to dispense the polymer solution over the wafer 102. The dispensing line 114 may include a dispensing head (not shown) as is known in the art to distribute the polymer solution over the wafer 120. A fluid line 130 (e.g., tubing) connects the polymer solution source 108 to the buffer tank 106. A fluid line 128 (e.g., tubing) connects the buffer tank 106 to the pump 102. The fluid line 130 is always open to allow a continuous fluid path from the polymer solution source 108 to the pump 102. The fluid line 130 and 128, and the dispensing line 114 are in communication with each other.

Still with FIG. 1, the polymer solution source 108 stores the polymer solution (e.g., a photoresist solution) to be coated over the wafer 120. The buffer tank 106 also stores the polymer solution to be coated over the wafer 120. The buffer tank 106 acts as a buffer zone for the polymer solution to ensure that the pump 102 will always channel or draw in the polymer solution and not air, for example as when the polymer solution source 108 is low or substantially empty. In one embodiment, the buffer tank 106 is configured to have a volume ranging between 0–500 cc. Other suitable volume is possible. Low or substantially empty refers to a level in the polymer solution source 108 that will cause the pump 102 to draw in air due to insufficient liquid level in the polymer solution source 108. The buffer tank 106 provides a uniform flow of the polymer solution since without the buffer tank 106, replacing the polymer solution source when it is low or substantially empty would disrupt the flow and cause contamination and/or non-uniformity in the coated film on the wafer 120. For example, when the polymer solution source 108 is low or substantially empty, the buffer tank 106 allows for more time for the replacement of the polymer solution source 108. The buffer tank 106 provides a constant flow for the polymer solution. The buffer tank 106 also maintains a relatively constant level of polymer solution predetermined to be sufficient to prevent the pump 102 from having to draw air into the dispensing line 114. Because fluid is channeled or drawn from the polymer source 108 through the buffer tank 106 in a continuous fluid path, the polymer solution level in the buffer tank 106 remains relatively constant. In addition, without the buffer tank 106, the wafer 120 needs to be pre-treated or pre-wet with a polymer solution. The presence of the buffer tank 106 eliminates the need to pre-treat the wafer 120. Thus, less polymer solution is needed to coat the wafer 120 allowing for cost cutting especially when the polymer solution is a photoresist solution.

Still with FIG. 1, in one embodiment, a fluid sensor 118 is installed into a vent line 122 that leads out from the buffer tank 106. The fluid sensor 118 detects the fluid level within the buffer tank 106 and/or the vent line 122 to provide an indication of bubbles or micro bubbles that may be present in the buffer tank 106. The fluid sensor 118 is configured to be in communication with a release valve 124 such that when bubbles or micro bubbles are detected in the buffer tank 106, the release valve 124 is open to allow for the elimination of the bubbles. The bubble or micro bubble elimination process is often desired when a new polymer solution source 108 is installed or when the polymer solution needs to be out-gassed. The release valve 124 may be a manual release valve that requires an operator to open to release the bubbles. Alternatively, the release valve 124 may be configured to be automatically triggered to be opened when bubbles are detected or configured to be opened upon demand the as a result of the fluid sensor 118 sensing the presence of the bubbles.

Still with FIG. 1, the enable valve 104 is connected between the buffer tank 106 and the pump 102. The enable valve 104 is placed in a fluid line 128 that acts as a conduit for the polymer solution between the buffer tank 106 and the pump 102. The enable valve 104 may be incorporated into an outlet leading out from the buffer tank 106. When the enable valve 104 is opened, the pump 102 is able to draw the polymer solution in a continuous fluid path from the buffer tank 106 and the polymer solution source 108 to dispense polymer solution on the wafer 120. In addition, the enable valve 104 is configured to be able to shut off when the coating system 100 indicates that the polymer solution source 108 is low or substantially empty. The enable valve 104 may be configured to automatically shut off in the event the system 100 indicates that the polymer solution source 108 is low or substantially empty. Substantially low indicates that the polymer solution in the polymer solution source 108 is so low that air may be drawn into the lines if the pump 102 is allowed to continue to draw from the polymer solution source 108.

Still with FIG. 1, in one embodiment, a fluid sensor 126 is connected to the polymer solution source 108. The fluid sensor 126 is configured to detect the fluid level in the polymer solution source 108. The fluid sensor 126 is also configured to convey the detection to a controller (not shown) to cause the enable valve 104 to shut down to prevent the pump 102 from drawing the polymer solution.

In one embodiment, the system 100 includes a temperature control 116 in communication with the dispensing line 114. The temperature control 116 allows for the monitoring of the dispensing temperature of the polymer solution. In one embodiment, the polymer solution is dispensed at a temperature between about 10° C. and 30° C.

In one embodiment, the system 100 includes a dispensing valve 132 placed in line with the pump 102. In one embodiment, the dispensing valve 132 is configured to control the dispensing rate of the polymer solution onto the wafer 120. The dispensing valve 132 may cooperate with the pump 102 to control the dispensing rate of the polymer solution. The dispensing valve 132 may also be configured to shut off the dispensing of the polymer solution. In addition, the dispensing valve 132 may also be configured to have a suck-back function such that when the dispensing process is complete or otherwise halted, the polymer solution may be sucked back within the dispensing line 114 to prevent excess or undesirable drip on the wafer 120.

Still with FIG. 1, the pressure source 110 is provided to apply a small amount of pressure into the polymer solution source 108 to the transfer of the polymer solution to the buffer tank 106. In one embodiment, an inert gas such as nitrogen ($N_2$) is flown into the polymer solution source 108 to create a small pressure (e.g., about less than 10 psi) within the polymer solution source 108 which in turn causes the polymer solution to be pushed or transferred to the buffer tank 106. In one embodiment, the inert gas (e.g., $N_2$) is flown at a rate of about 1–5 sccm. The flow of the inert gas into the polymer solution source 108 to bring about the transfer of the polymer solution may create micro bubbles in the buffer tank 106. The bubbles may be vented through the release valve 124 as previously described.

As shown in FIG. 1, the momentary valve 112 is placed between the pressure source 110 and the polymer solution source 108. The momentary valve 112 functions to prevent excess inert gas to be flown into the polymer solution source 108. For example, an operator may turn on a valve to apply pressure into the polymer solution source 108 and inadvertently neglect to turn off the valve after the transfer is complete. Continuous flow of the inert gas into the polymer solution source 108 may cause micro bubbles to be generated which then can travel into the buffer tank 106 and cause contamination and non-uniformity in the solution. In one embodiment, the momentary valve 112 is a manually operated valve that requires the operator to manually press down on the valve 112 to allow the flow of the inert gas into the polymer solution source 108. In one embodiment, the operator presses down on the valve 112 for a few seconds (e.g., 5 seconds) to generate sufficient pressure in the polymer solution source 108 to transfer the polymer solution into the buffer tank 106. In another embodiment, the momentary valve 112 is configured so that it will turn on only for a predetermined amount of time (e.g., about 5 seconds) so that no excess inert gas is flown into the polymer solution source 108.

Applying pressure to transfer the polymer solution into the buffer tank 106 prevents non-uniform concentration of the polymer solution in the buffer tank 106. For instances when a vacuum source (not shown) is used to cause the transfer of the polymer solution into the buffer tank 106, too high of a vacuum level may cause splashing of the polymer solution onto the wall of the buffer tank. Dried solution may later on cause a change in the solution concentration.

In one embodiment, a controller (e.g., a processor or microprocessor operated on a computer) (not shown) is included in the coating system 10 to control the operation of the components of the system 100. For example, the controller may control the flow of the polymer solution, the functions of the pump 102, the dispensing valve 132, the enable valve 102, and the momentary valve 112. The controller may also control the shut down of the valve 104 when the sensor 126 indicates that the level in the polymer solution source 108 is insufficient for drawing or channeling polymer solution. The controller may also control the momentary valve 112, e.g., to keep the momentary valve 112 open for a predetermined amount of time (e.g., 1–7 seconds) to allow a flow of inert gas into the polymer solution source 108 to transfer the polymer solution into the buffer bank 106. The controller may also control the venting of the buffer tank 106, the temperature of the dispensing line 114, the dispensing valve 132, and the like of the coating system 100. The controller may be housed in a computer or similar machine. The controller may also be ran by a set of instructions programmed to carry out the coating and/or operation of the coating system 100.

Figure 2:
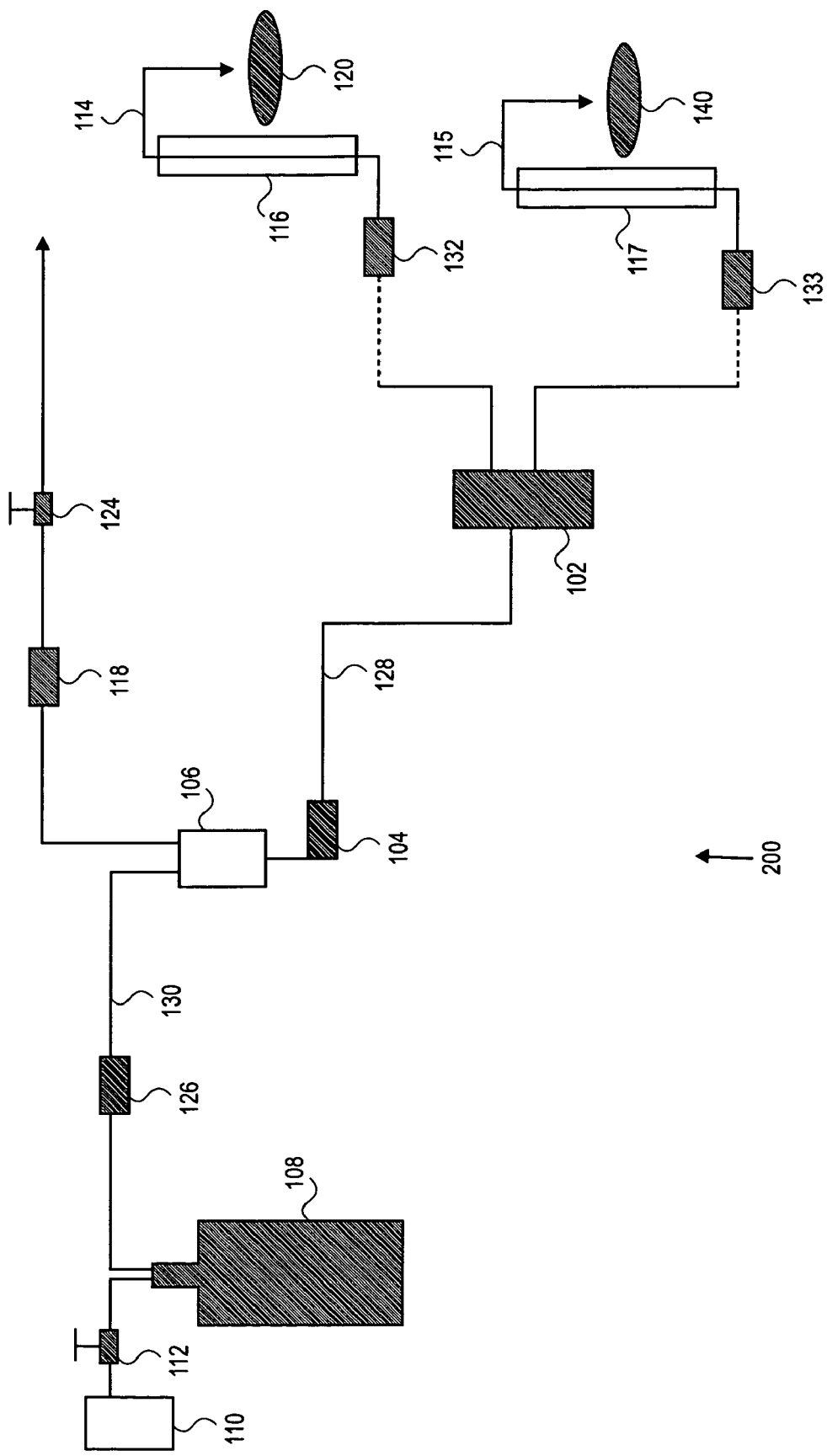
FIG. 2 illustrates another embodiment of a polymer solution coating system in accordance with the present invention.

In one embodiment, the polymer solution coating system 100 is modified for coating multiple wafers. As shown in FIG. 2, a polymer solution coating system 200 is configured to accommodate for the coating of multiple wafers. In one embodiment, only the polymer solution source 108 is provided. The polymer solution coating system 200 is similar to the polymer solution coating system 100 in all aspects except that the pump 102 is configured to draw the polymer solution for the coating of two wafers, wafer 120 and wafer 140. As illustrated in this figure, the pump 102 is connected to two dispensing valves 132 and 133, which dispense the polymer solution into the dispensing lines 114 and 115, respectively. The dispensing line 114 dispenses the polymer solution to coat the surface of the wafer 120 as previously discussed, and the dispensing line 115 dispenses the polymer solution to coat the surface of the wafer 140 in similar fashion. The temperature control 116 monitors the dispensing temperature for the dispensing line 114 and temperature control 117 monitors the dispensing temperature for the dispensing line 115.

Figure 3:
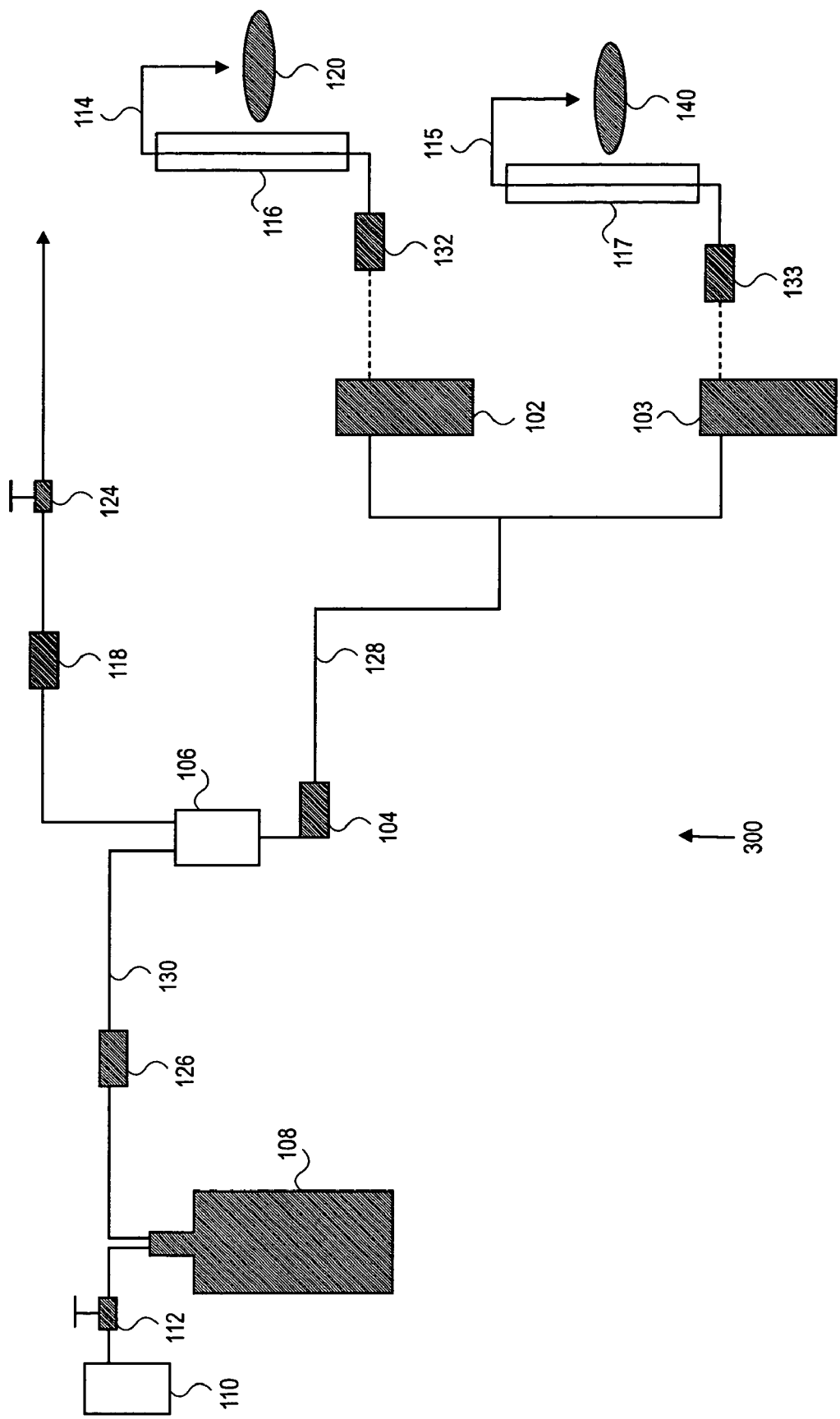
FIG. 3 illustrates another embodiment of a polymer solution coating system in accordance with the present invention.

In one embodiment, the polymer solution coating system 100 is modified for coating multiple wafers using multiple pumps. As shown in FIG. 3, a polymer solution coating system 300 is configured to accommodate for the coating of multiple wafers using one polymer solution source 108 and multiple pumps (pumps 102 and 103). In one embodiment, each pump is used to control the dispensing for one wafer. The polymer solution coating system 300 is similar to the polymer solution coating system 100 in all aspects except that in addition to the pump 102, a pump 103 is included to accommodate for the coating of a wafer 140 using a separate pump. This configuration differs from the coating system 200 in that each of the dispensing lines 114 and 115 can dispense the polymer solution at a different rate and different time. Thus, the coating system 300 allows for more freedom in coating multiple wafers. The coating system 300 includes all the components of the coating system 100 and in addition, the coating system 300 includes the pump 103 connected to a dispensing valve 133, which dispenses the polymer solution into the dispensing line and 115. The dispensing line 115 dispenses the polymer solution to coat the surface of the wafer 140. The temperature control 117 monitors the dispensing temperature for the dispensing line 115.

Figure 4:
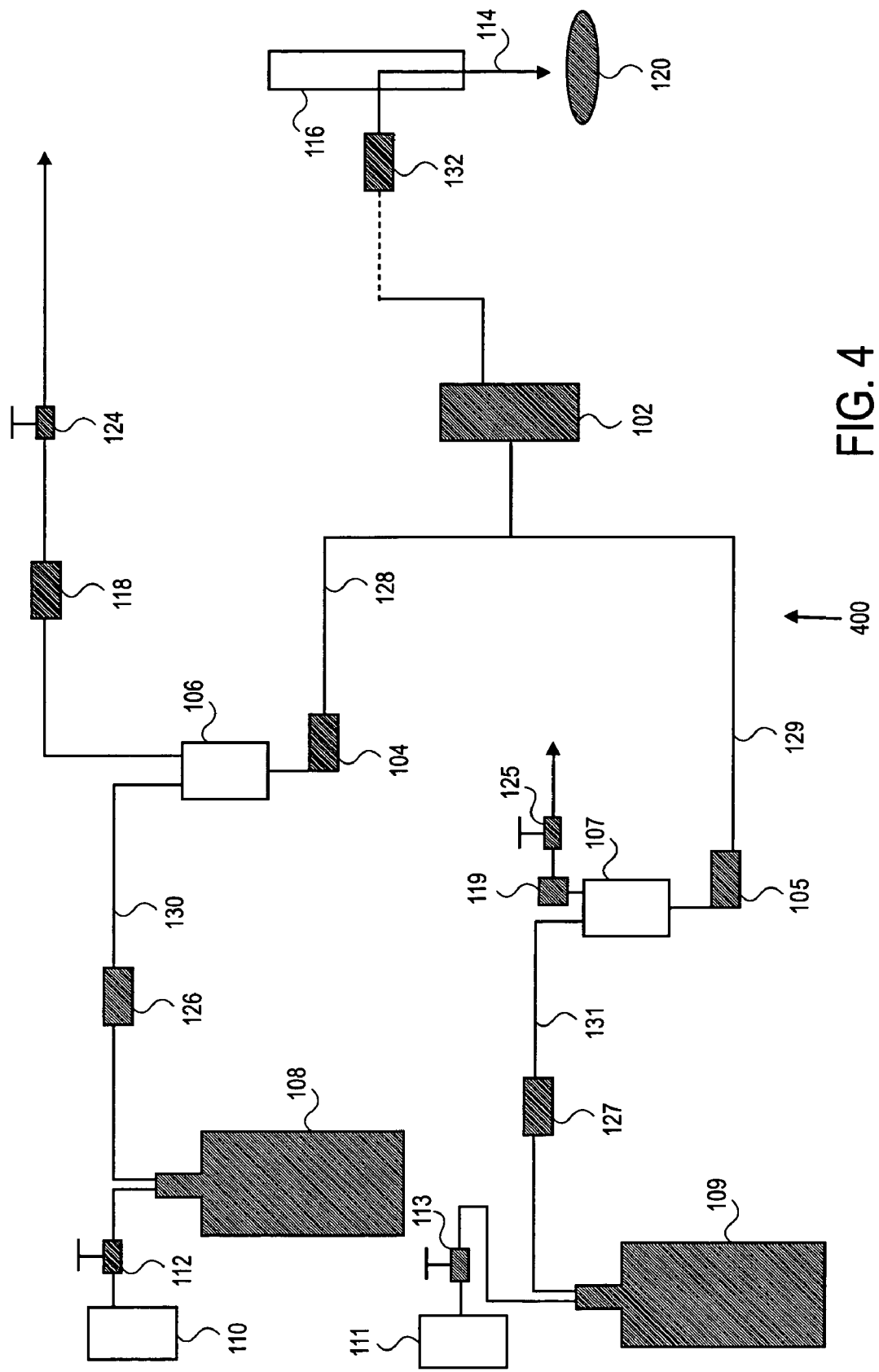
FIG. 4 illustrates another embodiment of a polymer solution coating system in accordance with the present invention.

In one embodiment, another polymer solution source is provided for the coating system. Providing the additional polymer solution source provides a back up polymer solution source for the coating system. As illustrated in FIG. 4, a polymer solution coating system 400 is provided with a polymer solution source 109. The polymer solution coating system 400 is similar to the polymer solution coating system 100 in all aspects except for the addition of the additional polymer solution source 109. The polymer solution source 109 includes all the associated components similar to the polymer solution source 108 previously described. An additional buffer tank 107 is provided for the polymer solution source 109. Similar to the polymer solution coating system 100, the polymer solution source 109, the buffer tank 107 and the pump 102 are connected in-line. In addition to the ability to draw the polymer solution from the polymer solution source 108 in a continuous fluid path as previously described, the pump 102 can also draw the polymer solution from the polymer solution source 109 in a continuous fluid path.

In one embodiment, a pressure source 111 is provided to apply a small amount of pressure into the polymer solution source 109 to the transfer of the polymer solution to the buffer tank 107. In one embodiment, an inert gas such as nitrogen ($N_2$) is flown into the polymer solution source 109 to create a small pressure (e.g., about less than 10 psi) within the polymer solution source 109 which in turn causes the polymer solution to be pushed or transferred to the buffer tank 107. A momentary valve 113 is a manual control valve placed between the pressure source 111 and the polymer solution source 109. The momentary valve 113 functions to prevent excess inert gas to be flown into the polymer solution source 109. Continuous flow of the inert gas into the polymer solution source 109 may cause micro bubbles to be generated which then can travel into the buffer tank 107 and cause contamination and non-uniformity in the solution. In one embodiment, the momentary valve 113 is a manually operated valve that requires the operator to manually press down on the valve 113 to allow the flow of the inert gas into the polymer solution source 109. In one embodiment, the operator presses down on the valve 113 for a few seconds (e.g., 5 seconds) to generate sufficient pressure in the polymer solution source 109 to transfer the polymer solution into the buffer tank 107. In another embodiment, the momentary valve 113 is configured so that it can be programmed to turn on for only a predetermined amount of time (e.g., about 5 seconds) so that no excess inert gas is flown into the polymer solution source 109.

Similar to the polymer solution coating system 100, the polymer solution coating system 400 includes a fluid sensor 127 for sensing the fluid level in the polymer solution source. The fluid sensor 127 can cause an enable valve 105 to close to prevent the pump 102 from drawing the polymer solution from the polymer solution source 109 when the polymer solution source 109 is empty or substantially low. In addition, the polymer solution coating system 400 also includes a release valve 125, which is opened to eliminate the bubbles or micro bubbles that are formed or present in the buffer tank 107. The release valve 125 is activated when the sensor 119 detects bubbles in the buffer tank 107.

In one embodiment, the enable valves 104 and 105 are automatic switching valves that will automatically switch off when their associated senor senses a substantially low or empty level of polymer solution in its associated polymer solution source. The sensor 126 and 127 are used to sense and indicate the polymer solution level in the polymer solution source 108 and 109. Thus, for example, when the sensor 126 detects that the polymer solution in the polymer solution source 108 is substantially low or empty, it will cause the enable valve 104 to shut off and cause the direction of the pump 102 to switch to another polymer solution source such as a polymer solution source 109. Thus, when the polymer solution source 108 is substantially low or empty, the pump 102 draws from the polymer solution source 109. The system 400 minimizes the down time in the coating process as well as ensures that contamination (such as by micro bubbles) is minimized.

Figure 5:
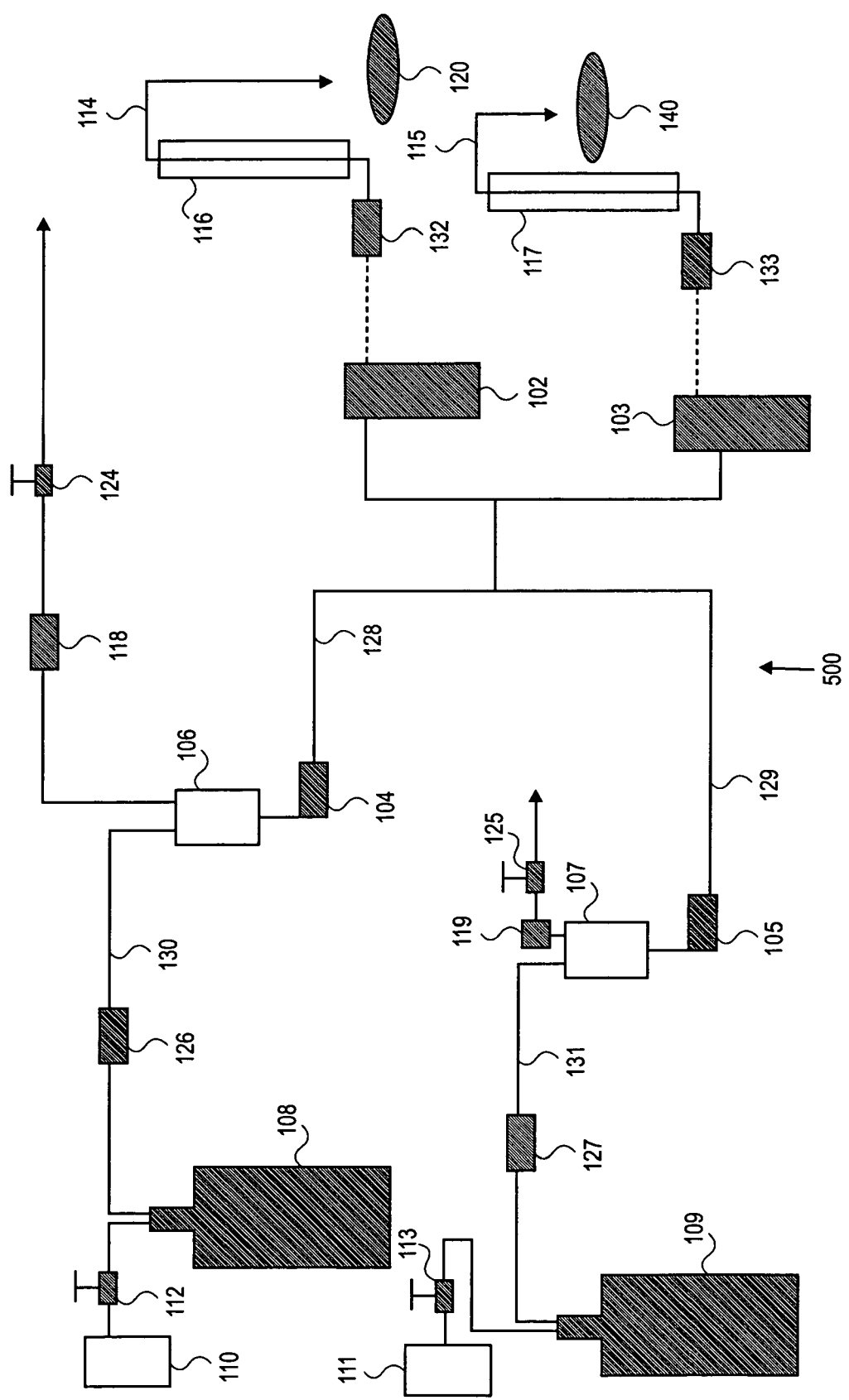
FIG. 5 illustrates another embodiment of a polymer solution coating system in accordance with the present invention.

In one embodiment, the polymer solution coating system 400 is modified for coating multiple wafers using multiple pumps. As shown in FIG. 5, a polymer solution coating system 500 is configured to allow for coating multiple wafers using multiple polymer solution sources (e.g., the polymer solution source 108 and the polymer solution source 109) and multiple pumps (e.g., pumps 102 and 103). In one embodiment, each pump is used to control the dispensing for one wafer. This configuration differs from the coating system 400 in that each of the dispensing lines 114 and 115 can dispense the polymer solution at a different rate and different time. Thus, the coating system 500 allows for more freedom in coating multiple wafers.

The pump 102 is connected in-line with the buffer tank 106 and the polymer solution source 108 such that a continuous fluid path is drawn from the polymer solution source 108 by the pump 102 through the buffer tank 106 to dispense the polymer solution on the wafer 120 as in previous embodiments. The pump 103 is connected in-line with the buffer tank 107 and the polymer solution source 109 such that a continuous fluid path is drawn from the polymer solution source 109 by the pump 103 through the buffer tank 107 to dispense the polymer solution on the wafer 140. The pump 103 dispenses the polymer solution onto the wafer 140 through the dispensing line 115. The polymer solution coating system 400 is similar to the polymer solution coating system 100 in all aspect except that in addition to the pump 102, a pump 103 is included to allow for the dispensing of the polymer solution for a wafer 140. In addition, the pump 103 is connected to a dispensing valve 133, which dispenses the polymer solution into the dispensing line and 115. The dispensing line 115 dispenses the polymer solution to coat the surface of the wafer 140. The temperature control 117 monitors the dispensing temperature for the dispensing line 115.

Figure 6:
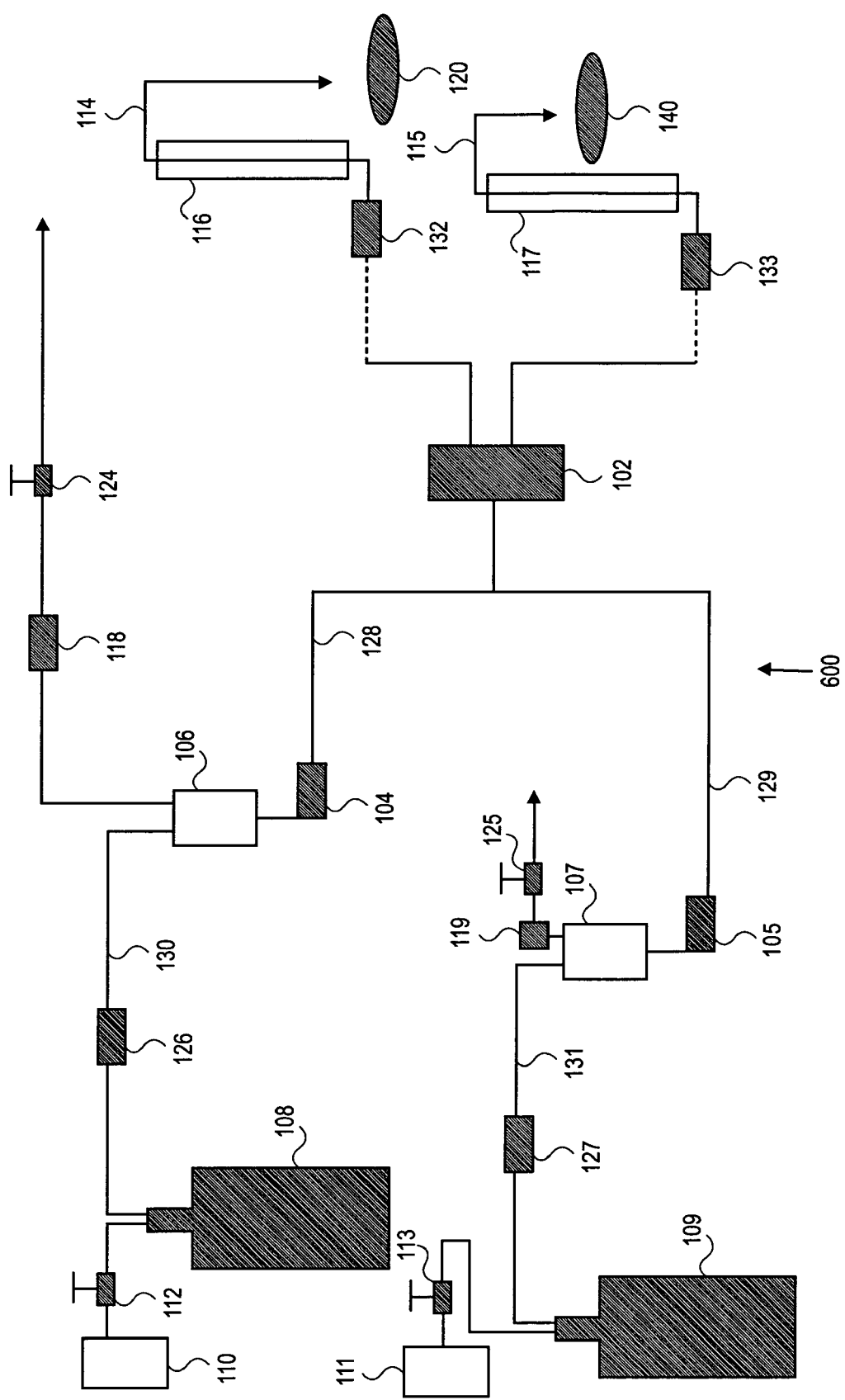
FIG. 6 illustrates another embodiment of a polymer solution coating system in accordance with the present invention.

In one embodiment, the polymer solution coating system 400 is modified for coating multiple wafers using only one pump 102. As shown in FIG. 6, a polymer solution coating system 600 is configured to allow for coating multiple wafers using one polymer solution source 108. The polymer solution coating system 600 is similar to the polymer solution coating system 400 in all aspects except that the pump 102 is configured to draw the polymer solution for the coating of two wafers, wafer 120 and wafer 140. As illustrated in this figure, the pump 102 is connected to two dispensing valves 132 and 133, which dispense the polymer solution into the dispensing line 114 and 115, respectively. The dispensing line 114 dispenses the polymer solution to coat the surface of the wafer 120 and the dispensing line 115 dispenses the polymer solution to coat the surface of the wafer 140. The temperature control 116 monitors the dispensing temperature for the dispensing line 114 and temperature control 117 monitors the dispensing temperature for the dispensing line 115.

As with any of the modified embodiments, a controller can be included with the coating system for controlling the operation of the coating system as previously discussed.

Figure 7:
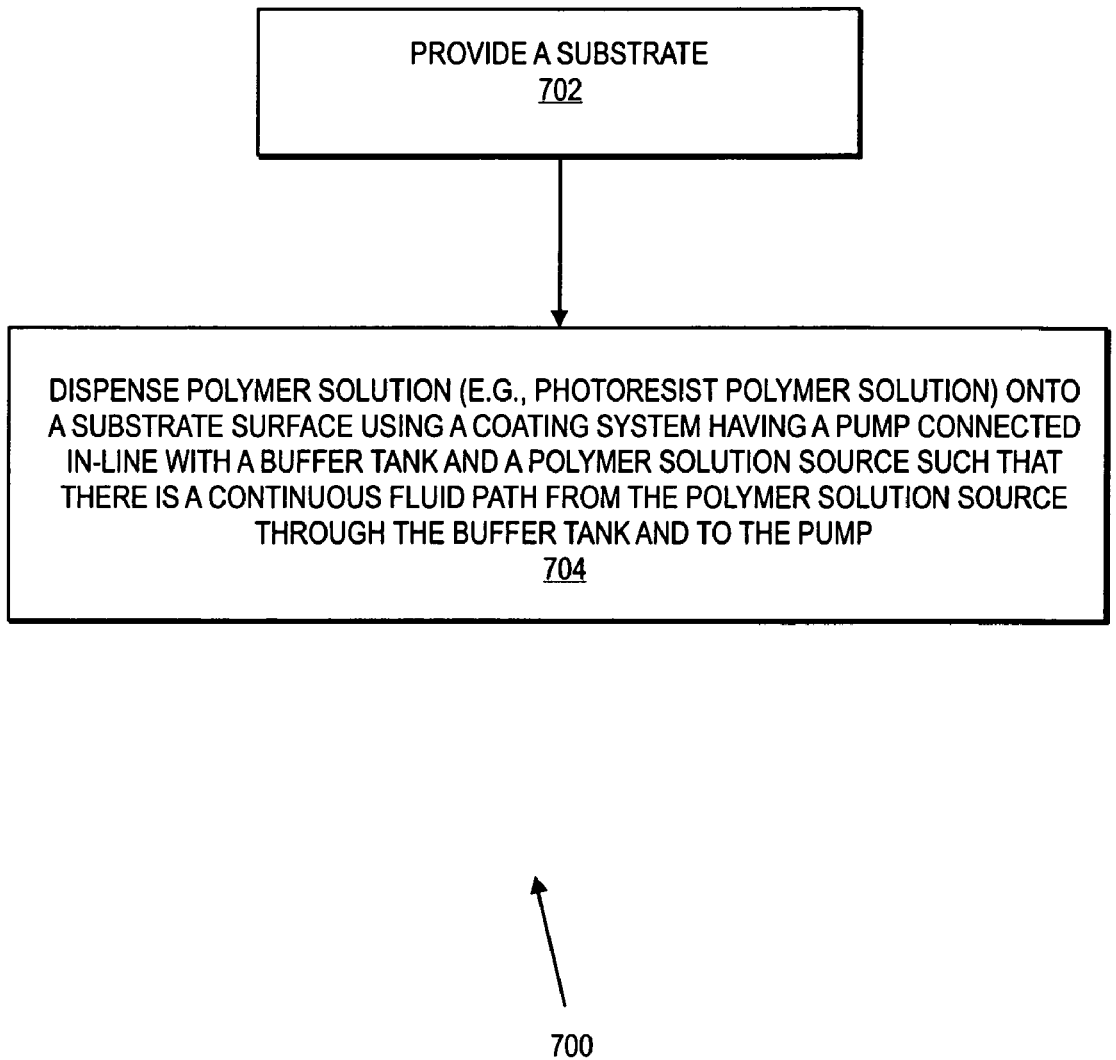
FIG. 7 illustrates an exemplary method of coating a polymer solution on a surface of a substrate.

FIG. 7 illustrates an exemplary embodiment of a method 700 of coating a polymer layer such as a photoresist layer on a surface substrate using one of the exemplary coating systems previous described. At box 702, a substrate is provided. In one embodiment, the substrate is a semiconductor wafer used in the manufacture of integrated circuits. The substrate may have patterns and structures formed thereon as is known in the art.

At box 704, a polymer solution is dispensed over a surface of the substrate. In one embodiment, the polymer solution is a photoresist solution used in the manufacture of integrated circuits. In other embodiments, the polymer solution includes solutions used to form organic planarization films, anti-reflection films, siloxane spin-on-glass films polyimide films, polimide siloxane films, and other films typically used in the manufacture of integrated circuits.

The polymer solution is dispensed using one of the exemplary embodiments of the coating system of the present invention (e.g., coating system 100, 200, 300, 400, 500, or 600). The coating system includes a pump connected in-line with a buffer tank and a polymer solution source as previously discussed. There is a continuous fluid path from the polymer solution source through the buffer tank and the pump. Thus, when the pump is drawing the polymer solution source to dispense it over the substrate surface, the polymer solution flows from the polymer solution source to the pump in a continuous path.

In one embodiment, the substrate is placed in a housing or a chamber, which allows the atmosphere in the chamber to be at least partially saturated with solvent molecules. This may improve the cast film wetability by establishing a monolayer of coating solvent on the surfaces of the substrate. In addition, thickness uniformity may be improved with a controlled coating environment.

In one embodiment, a spin-cast method is used for the coating of the polymer solution on the substrate. Thus, after the polymer solution is dispensed, the substrate is spun or rotated to spread the solution over the surface of the substrate. The substrate may be placed on a rotable chuck that has a suitable rotating velocity commonly used for spin-cast coating. After the solution has spread over the substrate surface, the solvent is evaporated to leave a layer of solute on the surface of the substrate. In the embodiment where the polymer solution is a photoresist solution, after the evaporation, a photoresist layer is formed over the substrate surface.

In another embodiment, a spray-coat method is used for the coating of the polymer solution on the substrate. The polymer solution may be dispensed onto the substrate surface using a shower head configured to dispense the polymer solution over the substrate surface.

Figure 8:
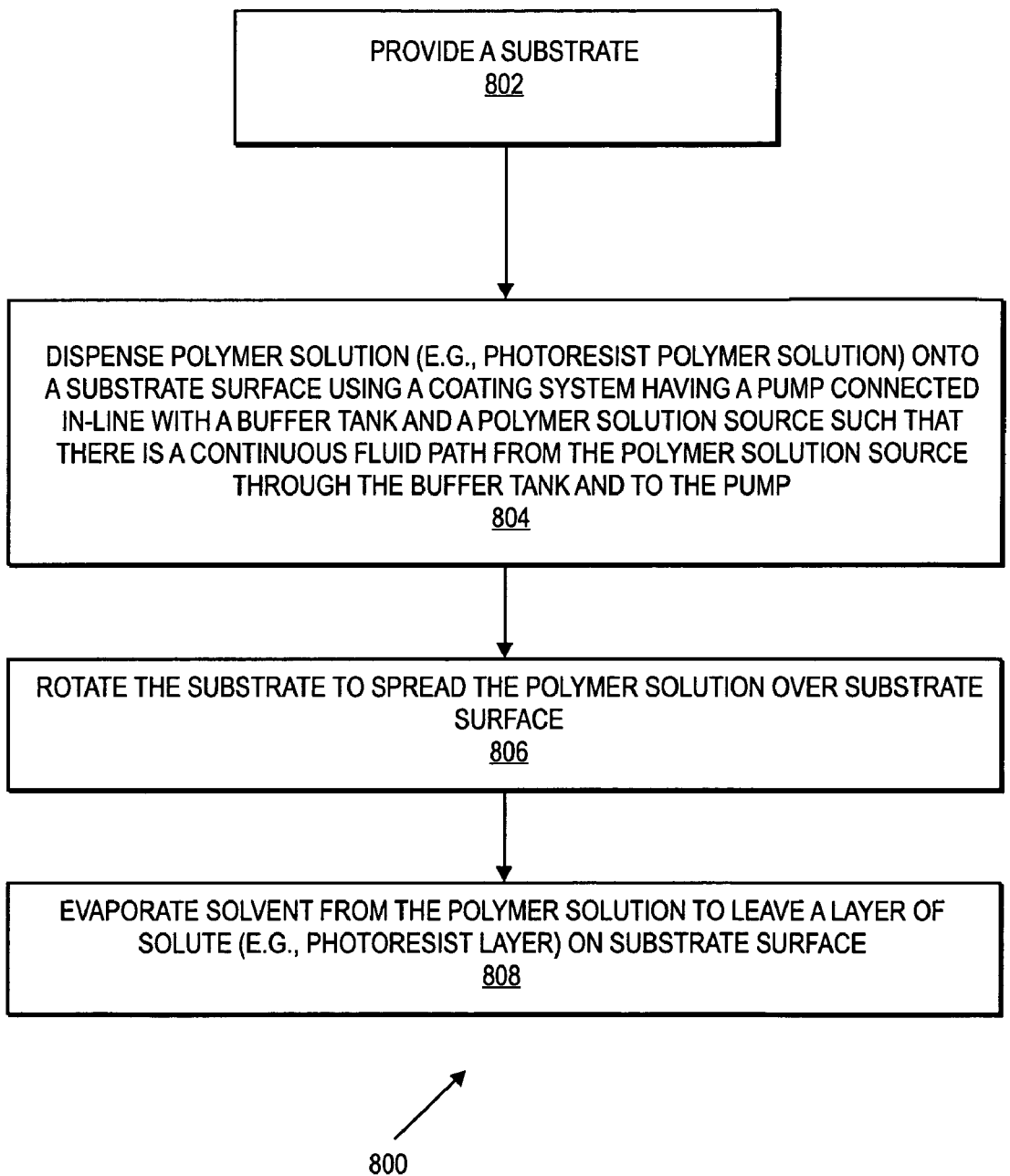
FIG. 8 illustrates an exemplary method of coating a polymer solution on a surface of a substrate.

FIG. 8 illustrates another exemplary embodiment of a method 800 of coating a polymer layer such as a photoresist layer on a surface substrate using one of the exemplary coating systems previous described. At box 802, a substrate is provided. In one embodiment, the substrate is a semiconductor wafer used in the manufacture of integrated circuits. The substrate may have patterned and structures formed thereon as is known in the art.

At box 804, a polymer solution is dispensed over a surface of the substrate. In one embodiment, the polymer solution is a photoresist solution used in the manufacture of integrated circuits. In other embodiments, the polymer solution includes solutions used to form organic planarization films, anti-reflection films, siloxane spin-on-glass films polyimide films, polimide siloxane films, and other films typically used in the manufacture of integrated circuits.

The polymer solution is dispensed using one of the exemplary embodiments of the coating system of the present invention (e.g., coating system 100, 200, 300, 400, 500, or 600). The coating system includes a pump connected in-line with a buffer tank and a polymer solution source as previously discussed. There is a continuous fluid path from the polymer solution source through the buffer tank and the pump. Thus, when the pump is drawing the polymer solution source to dispense it over the substrate surface, the polymer solution flows from the polymer solution source to the pump in a continuous path.

In one embodiment, the substrate is placed in a housing or a chamber, which allows the atmosphere in the chamber to be at least partially saturated with solvent molecules. This may improve the cast film wetability by establishing a monolayer of coating solvent on the surfaces of the substrate. In addition, thickness uniformity may be improved with a controlled coating environment.

At box 806, the substrate is spun or rotated to spread the solution over the surface of the substrate. The substrate may be rotated after the polymer solution is dispensed or simultaneously with the solution being dispensed over the substrate. The substrate may be placed on a rotable chuck that has a suitable rotating velocity commonly used for spin-cast coating. At box 808, the solvent is evaporated after the polymer solution is dispensed on the substrate to leave a layer of solute on the surface of the substrate. In the embodiment where the polymer solution is a photoresist solution, after the evaporation, a photoresist layer is formed over the substrate surface.

Figure 9:
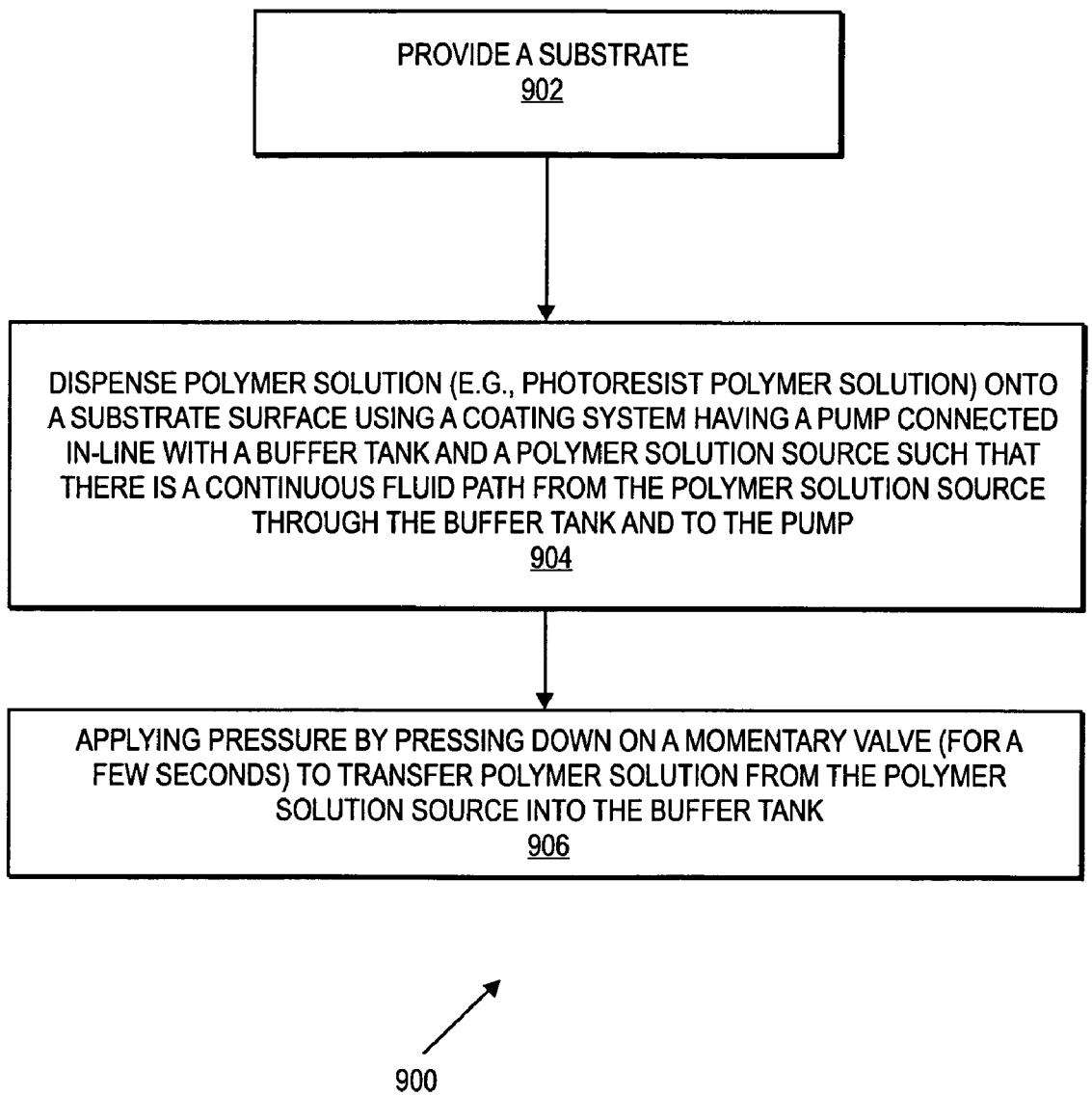
FIG. 9 illustrates an exemplary method of coating a polymer solution on a surface of a substrate.

FIG. 9 illustrates an exemplary embodiment of a method 900 of coating a polymer layer such as a photoresist layer on a surface substrate using one of the exemplary coating systems previous described. At box 902, a substrate is provided. In one embodiment, the substrate is a semiconductor wafer used in the manufacture of integrated circuits. The substrate may have patterned and structures formed thereon as is known in the art.

At box 904, a polymer solution is dispensed over a surface of the substrate. In one embodiment, the polymer solution is a photoresist solution used in the manufacture of integrated circuits. In other embodiments, the polymer solution includes solutions used to form organic planarization films, anti-reflection films, siloxane spin-on-glass films polyimide films, polimide siloxane films, and other films typically used in the manufacture of integrated circuits.

The polymer solution is dispensed using one of the exemplary embodiments of the coating system of the present invention (e.g., coating system 100, 200, 300, 400, 500, or 600). The coating system includes a pump connected in-line with a buffer tank and a polymer solution source as previously discussed. There is a continuous fluid path from the polymer solution source through the buffer tank and the pump. Thus, when the pump is drawing the polymer solution source to dispense it over the substrate surface, the polymer solution flows from the polymer solution source to the pump in a continuous path.

At box 906 pressure is applied to the polymer solution source to get the polymer solution to transfer to the buffer tank. The buffer tank is filled to a predetermined level suitable to prevent the pump from drawing air in the event that the polymer solution source becomes empty or substantially low. In one embodiment, the buffer tank maintains a constant level of polymer solution in it to allow for easy for replacing the polymer solution source when the polymer solution source is low or substantially empty. Low or substantially empty refers to a level in the polymer solution source that will cause the pump to draw in air due to insufficient liquid level in the polymer solution source. In one embodiment, the buffer tank is filled before the dispensing of the polymer solution. The buffer tank may be filled simultaneously with the dispensing if necessary.

In one embodiment, the substrate is placed in a housing or a chamber, which allows the atmosphere in the chamber to be at least partially saturated with solvent molecules. This may improve the cast film wetability by establishing a monolayer of coating solvent on the surfaces of the substrate. In addition, thickness uniformity may be improved with a controlled coating environment.

In one embodiment, a spin-cast method is used for the coating of the polymer solution on the substrate. Thus, after the polymer solution is dispensed, the substrate is spun or rotated to spread the solution over the surface of the substrate. The substrate may be placed on a rotable chuck that has a suitable rotating velocity commonly used for spin-cast coating. After the solution has spread over the substrate surface, the solvent is evaporated to leave a layer of solute on the surface of the substrate. In the embodiment where the polymer solution is a photoresist solution, after the evaporation, a photoresist layer is formed over the substrate surface.

In another embodiment, a spray-coat method is used for the coating of the polymer solution on the substrate. The polymer solution may be dispensed onto the substrate surface using a shower head configured to dispense the polymer solution over the substrate surface.

In any of the methods described, multiple substrates can be coated at the same time or different time using the same coating system. For example, as previously discussed, more dispensing lines can be included to allow for coating multiple substrates (e.g., as in the coating system 200). In addition, more polymer solution sources can be included to allow for the switching from an empty or substantially low polymer solution source to a full one. In this way, the empty or substantially low polymer solution source can be replaced without disrupting the coating process.

Having disclosed exemplary embodiments, modifications and variations may be made to the disclosed embodiments while remaining within the spirit and scope of the invention as defined by the appended claims.

I claim:

1. A method of coating a surface of a substrate with a polymer solution, comprising:
    providing the substrate; and
    dispensing the polymer solution onto the surface of the substrate using a coating system having a pump connected in-line with a buffer tank and a polymer solution source, the pump to draw the polymer solution from the polymer solution source and the buffer tank in a continuous fluid path to dispense the polymer solution, the polymer solution source being connected to a pressure source capable of causing the polymer solution to be transferred from the polymer solution source into the buffer tank, the buffer tank to maintain a constant level of polymer solution predetermined to be sufficient to prevent air from being drawn into a dispensing solution; and
    controlling a momentary valve placed between the pressure source and the polymer solution source that allows pressure to be applied to the polymer solution source, wherein a controlled activation of the momentary valve is needed to allow pressure to be applied to the polymer solution source; and
    wherein a fluid sensor and a release valve are placed in communication with the buffer tank for bubble release when bubbles are detected.

2. The method of claim 1 further comprises rotating the substrate to spread the polymer solution.

3. The method of claim 1 further comprises evaporating solvent from the polymer solution dispensed on the surface of the substrate to form a polymer layer on the surface of the substrate.

4. The method of claim 1 wherein the polymer solution is a photoresist solution.

5. The method of claim 1 further comprising:
    mounting the substrate on a rotable chuck.

6. The method of claim 1 further comprising:
    applying a pressure to the polymer solution source to transfer the polymer solution into the buffer tank.

7. The method of claim 6 further comprising:
    coupling a pressure source to the polymer solution source;
    coupling the momentary valve between the pressure source and the polymer solution source, the momentary valve to allow pressure to be applied to the polymer solution source with excess inert gas prevented.

8. The method of claim 6 wherein pressure is applied to the polymer solution source from a pressure source and wherein the momentary valve is used to manually apply pressure to the polymer solution source for a predetermined amount of time.

9. The method of claim 1 further comprises flowing an inert gas into the polymer solution source to create the pressure to transfer the polymer solution into the buffer tank.

10. A method of coating a surface of a substrate with a polymer solution, comprising:
    providing the substrate;
    dispensing the polymer solution onto the surface of the substrate using a coating system having a pump connected in-line with a buffer tank and a polymer solution source, the pump to draw the polymer solution from the polymer solution source and the buffer tank in a continuous fluid path to dispense the polymer solution, the polymer solution source being connected to a pressure source capable of causing the polymer solution to be transferred from the polymer solution source into the buffer tank, the buffer tank to maintain a constant level of polymer solution predetermined to be sufficient to prevent air from being drawn into a dispensing solution; and wherein an enable valve is placed between the buffer tank and the pump wherein opening the enable valve allows the polymer solution to flow to the pump, wherein a fluid sensor is coupled to the polymer solution source, the fluid sensor configured to detect the polymer solution level in the polymer solution source, and wherein the sensor is capable of shutting off the enable valve when the polymer solution level in the polymer solution source is detected to be substantially low or empty; and wherein a fluid sensor and a release valve are placed in communication with the buffer tank for bubble release when bubbles are detected.

11. A method of coating a surface of a substrate with a polymer solution, comprising:

providing the substrate; and dispensing the polymer solution onto the surface of the substrate using a coating system having a pump connected in-line with a buffer tank and a polymer solution source, the pump to draw the polymer solution from the polymer solution source and the buffer tank in a continuous fluid path to dispense the polymer solution, the polymer solution source being connected to a pressure source capable of causing the polymer solution to be transferred from the polymer solution source into the buffer tank, the buffer tank to maintain a constant level of polymer solution predetermined to be sufficient to prevent air from being drawn into a dispending solution, wherein an enable valve is placed between the buffer tank and the pump wherein opening the enable valve allows the polymer solution to flow to the pump, wherein a fluid sensor is coupled to the polymer solution source, the fluid sensor configured to detect the polymer solution level in the polymer solution source, and wherein the sensor is capable of shutting off the enable valve when the polymer solution level in the polymer solution source is detected to be substantially low or empty wherein the pump is connected in-line with at least a second buffer tank and a second polymer solution source, wherein a second enable valve is placed between the second buffer tank and the pump wherein opening of the second enable valve allows the polymer solution to flow to the pump, wherein a second fluid sensor is coupled to the second polymer solution source, the second fluid sensor configured to detect the polymer solution level in the second polymer solution source, and wherein the second sensor is capable of shutting off the second enable valve when the polymer solution level in the second polymer solution source is detected to be substantially low or empty.

12. The method of claim 11 each of the first sensor and the second sensor is capable of switching pumping direction of the pump away from an empty or substantially low polymer solution source.

13. A method of coating a surface of a substrate with a polymer solution, comprising:

securing a substrate on a rotable substrate station;

dispensing the polymer solution onto the surface of the substrate using a pump, wherein dispensing the polymer solution further comprises, drawing a polymer solution using a coating system having a pump being connected in-line with a buffer tank and a polymer solution source, the pump drawing the polymer solution from the polymer solution source and the buffer tank in a continuous fluid path to dispense the polymer solution on the surface of the substrate, and maintaining a constant level of polymer solution in the buffer tank; and spinning the substrate to coat the dispensed polymer solution over the surface; and wherein a fluid sensor and a release valve are placed in communication with the buffer tank for bubble release when bubbles are detected.

14. A method of coating a surface of a substrate with a polymer solution comprising:

securing a substrate on a rotable substrate station;

dispensing the polymer solution onto the surface of the substrate using a pump, wherein dispensing the polymer solution further comprises, drawing a polymer solution using a coating system having a pump being connected in-line with a buffer tank and a polymer solution source, the pump drawing the polymer solution from the polymer solution source and the buffer tank in a continuous fluid path to dispense the polymer solution on the surface of the substrate, and maintaining a constant level of polymer solution in the buffer tank; and spinning the substrate to coat the dispensed polymer solution over the surface; and connecting a first buffer tank and a first polymer solution source in-line with the pump wherein the first buffer tank is connected between the first polymer solution source and the pump;

connecting a second buffer tank and a second polymer solution source in-line with the pump wherein the second buffer tank is connected between the second polymer solution source and the pump;

providing a sensor to sense the polymer solution level for each of the first polymer solution source and the second polymer solution source;

providing an enable valve being communicative with the sensor and the pump, the enable valve being able to direct the pump away from an empty polymer solution source.

15. The method of claim 14 further comprises applying an inert gas into the polymer solution source by pressing down on a momentary valve coupled to the polymer solution source to transfer a sufficient amount of polymer solution into the buffer tank to prevent the pump from drawing air, the momentary valve requiring a manual activation to apply the inert gas to the polymer solution source.

16. The method of claim 14 further comprises rotating the substrate to spread the polymer solution.

17. The method of claim 14 further comprises evaporating solvent from the polymer solution dispensed on the surface of the substrate to form polymer layer on the surface of the substrate.

* * * * *